(12) United States Patent
Chung

(10) Patent No.: US 7,087,533 B2
(45) Date of Patent: Aug. 8, 2006

(54) METHOD FOR FABRICATING SEMICONDUCTOR DEVICE

(75) Inventor: Su Ock Chung, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 126 days.

(21) Appl. No.: 10/608,530

(22) Filed: Jun. 30, 2003

(65) Prior Publication Data
US 2004/0127034 A1  Jul. 1, 2004

(30) Foreign Application Priority Data
Dec. 31, 2002  (KR) ...................... 10-2002-0088156

(51) Int. Cl.
  *H01L 21/302*  (2006.01)

(52) U.S. Cl. ...................... 438/720; 438/253; 438/595; 438/706

(58) Field of Classification Search ................ 438/253, 438/257, 259, 629, 595, 706, 710, 720, 692
See application file for complete search history.

(56) References Cited

U.S. PATENT DOCUMENTS

| | | | | |
|---|---|---|---|---|
| 5,792,687 A | * | 8/1998 | Jeng et al. | .................... 438/253 |
| 6,696,365 B1 | * | 2/2004 | Kumar et al. | ............... 438/706 |

FOREIGN PATENT DOCUMENTS

KR  1999-0088491  12/1999

\* cited by examiner

*Primary Examiner*—Lan Vinh
(74) *Attorney, Agent, or Firm*—Heller Ehrman LLP

(57) ABSTRACT

A method for fabricating a semiconductor device, wherein a multi-layered hard mask layer having a stacked structure of nitride film/oxide film/nitride film is disclosed. The method for fabricating a semiconductor device comprises the steps of: forming a gate insulating film and a conductive layer for gate electrode; forming a multi-layered hard mask layer on the conductive layer, wherein each layer of the multi-layered hard mask layer is formed of materials different from one another; etching the structure to form a stacked structure of a gate insulating film pattern, a gate electrode and a hard mask layer pattern; forming an insulating film spacer; forming an interlayer insulating film on the entire surface; etching the interlayer insulating film to form a landing plug contact hole; forming a conductive layer for landing plug on the entire surface; and planarizing the conductive layer for a landing plug to form a landing plug.

1 Claim, 4 Drawing Sheets

METHOD FOR FABRICATING SEMICONDUCTOR DEVICE

BACKGROUND OF THE INVENTION

1. Field of the Invention

The present invention relates to a method for fabricating a semiconductor device, wherein a multi-layered hard mask layer having a stacked structure of nitride film/oxide film/nitride film for formation a gate electrode of a MOSFET (Metal Oxide Semiconductor Field Effect Transistor) is employed to protect a lower structure such as a gate electrode in a subsequent process without increasing the thickness of the hard mask layer, and to prevent void and patterning problem resulting from large step difference due to the thickness of the hard mask layer.

2. Description of the Prior Art

Developments in techniques for forming a microscopic pattern on a semiconductor substrate have led to an increased use of highly integrated semiconductor devices. Forming microscopic patterns in a semiconductor requires a photoresist film mask which is used commonly in etching and/or ion implantation to have microscopic patterns.

In general, the resolution (R) of a photoresist film pattern is proportional to the light wavelength ($\lambda$) and the process variable (k) of a micro exposure device. The resolution, however, is inversely proportional to the numerical aperture (NA) of the light exposure device.

[$R = k*\lambda/NA$, R=resolving power, $\lambda$=wave of light source, NA=numerical aperture]

Here, one can improve the resolution by decreasing the light wavelength, for example, the resolution of G-line ($\lambda$=436 nm) and i-line ($\lambda$=365 nm) micro exposure devices are about 0.7 µm and 0.5 µm, respectively. A photoresist film pattern below 0.5 µm typically requires a deep ultraviolet (DUV) light exposure device which generates a small wavelength length, for example, a KrF laser (248 nm) or an ArF laser (193 nm).

Other methods for improving the photoresist pattern resolution include using a phase shift mask as a photo mask; using a contrast enhancement layer (CEL) method to form a thin film to enhance an image contrast on a wafer; using a tri-layer resist (TLR) method having an intermediate layer, such as a spin on glass (SOG) film, between two photoresist films; and using a silylation method to selectively implant a silicon into the upper portion of a photoresist film.

In a highly integrated semiconductor device, the size of a contact hole connecting the upper and lower conductive interconnections and the space between the contact hole and the adjacent interconnection are smaller relative to a less integrated semiconductor device. In addition, the aspect ratio of the contact hole in a highly integrated semiconductor device is typically higher than a less integrated semiconductor device. Thus, a highly integrated semiconductor device having a multi-layer conductive interconnection requires a precise mask alignment during its fabrication process, which reduces the process margin, i.e., acceptable error limit.

In order to maintain a space between contact holes, in conventional processes, masks are formed with consideration to misalignment tolerance, lens distortion in the exposure process, critical dimension variation in the mask formation and photoetching processes, and mask registrations.

A direct etching method, a sidewall spacer forming method or a self aligned contact (SAC) method have been used for the above contact hole formation process.

The direct etching method and the sidewall spacer forming method cannot be used in fabricating a device having a design rule of less than 0.3 µm. As a result, those methods have limits in high integration of a device.

The self aligned contact (SAC) method to overcome some of the disadvantages of lithography processes typically uses a polysilicon, a nitride, or an oxide nitride material as an etching barrier film. Of these, a nitride material is preferably used as an etching barrier film.

FIGS. 1a through 1d are cross-sectional diagrams illustrating a conventional method for fabricating a semiconductor device.

Referring to FIG. 1a, a gate oxide film 12, a conductive layer 14 such as polysilicon layer or tungsten layer, and a hard mask layer consisting of a nitride film are sequentially formed on a semiconductor substrate 10.

Referring to FIG. 1b, a photoresist film pattern (not shown) for patterning a gate electrode is formed on the hard mask layer 16. The hard mask layer 16, the conductive layer 16 and the gate oxide film 12 are sequentially etched using the photoresist film pattern as a mask to form a gate electrode 18 including a hard mask layer 16 pattern. A portion of the hard mask layer 16 is removed in the etching process.

Referring to FIG. 1c, an insulating film spacer 20 is formed on a sidewall of the gate electrode 18 and the hard mask layer 16 pattern. Thereafter, an interlayer insulating film (not shown) is formed on the entire surface of the resulting structure. The interlayer insulating film is then etched to form a landing plug contact hole. Next, a polysilicon layer 22 for a landing plug is formed on the entire surface of the resulting structure.

Referring to FIG. 1d, the polysilicon layer 22 is planarized via a chemical mechanical polishing (CMP) process to form a landing plug 24. A portion of the hard mask layer 16 is again removed by the CMP process.

According to the conventional method, a hard mask layer is damaged during the formation process of the landing plug. This damage leads to an exposure of the gate electrode in a subsequent bitline, a storage electrode or metal contact formation process, resulting in short between wirings. When a mask layer is formed to have a sufficient thickness to overcome the above-described problem, large step difference is generated during the patterning process of the gate electrode. The insulating film formed in the subsequent process will not be able to fill the gap between gate electrodes, thereby generating a void. Moreover, the hard mask layer pattern remaining after a CMP process has poor uniformity resulting in degradation of yield and reliability of a device.

SUMMARY OF THE INVENTION

Accordingly, it is an object of the present invention to provide a method for fabricating a semiconductor device, wherein a multi-layered hard mask layer having a stacked structure of nitride film/oxide film/nitride film for formation a gate electrode is employed to protect a lower structure such as a gate electrode in a subsequent etching process such as a gate electrode patterning process, a landing plug formation process, or a bitline or storage electrode contact formation process without increasing the thickness of the hard mask layer, and to prevent void and patterning problem resulting from large step difference due to the thickness of the hard mask layer.

There is provided a method for fabricating a semiconductor device, comprising the steps of: sequentially forming a gate insulating film and a conductive layer for gate electrode on a semiconductor substrate; forming a multi-layered hard mask layer on the conductive layer, wherein each layer of the multi-layered hard mask layer is formed of materials different from one another; etching the hard mask layer, the conductive layer and the gate insulting film using a gate electrode mask to form a stacked structure of a gate insulating film pattern, a gate electrode and a hard mask layer pattern; forming an insulating film spacer on a sidewall of the stacked structure; forming an interlayer insulating film on the entire surface; etching the interlayer insulating film using a landing plug contact etching mask to form a landing plug contact hole exposing the semiconductor substrate; forming a conductive layer for a landing plug on the entire surface to fill the landing plug contact hole; and planarizing the conductive layer for a landing plug to form a landing plug.

DESCRIPTION OF THE PREFERRED EMBODIMENTS

The present invention will be described in more detail with reference to the accompanying drawings.

FIGS. 2a through 2d are cross-sectional diagrams illustrating a method for fabricating a semiconductor device in accordance with the present invention.

Figure 1A:
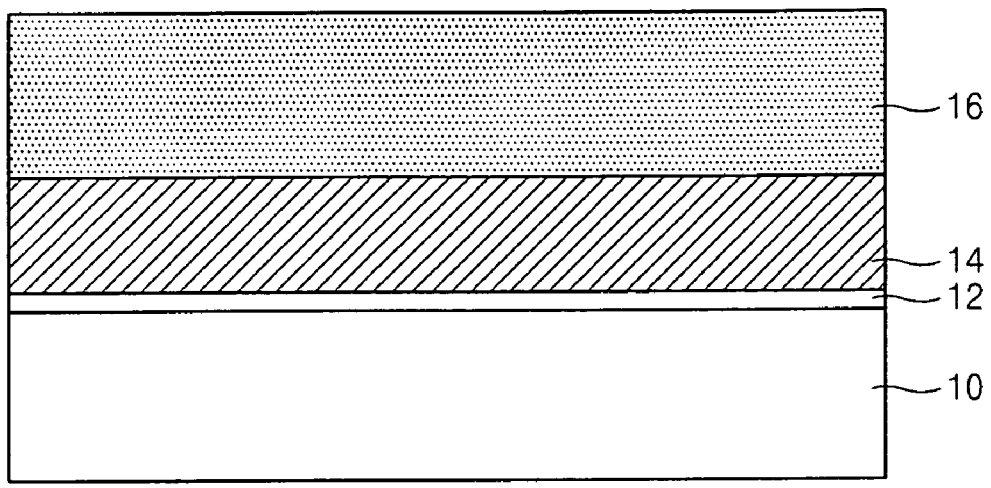
FIGS. 1a through 1d are cross-sectional diagrams illustrating a conventional method for fabricating a semiconductor device.
Figure 1B:
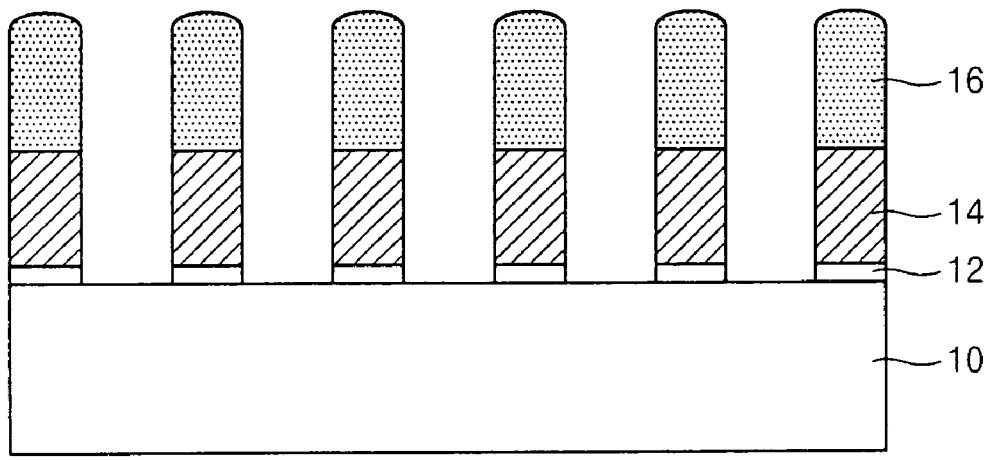
Figure 1C:
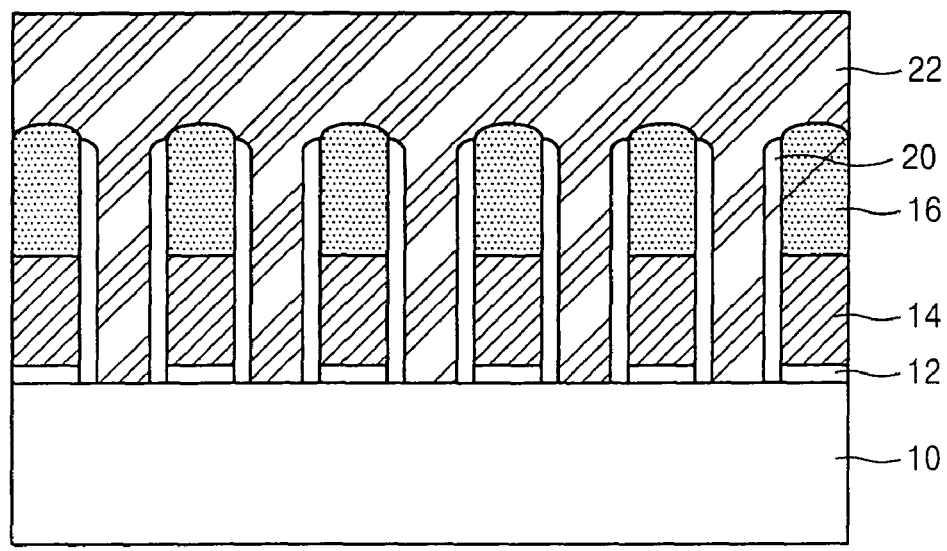
Figure 1D:
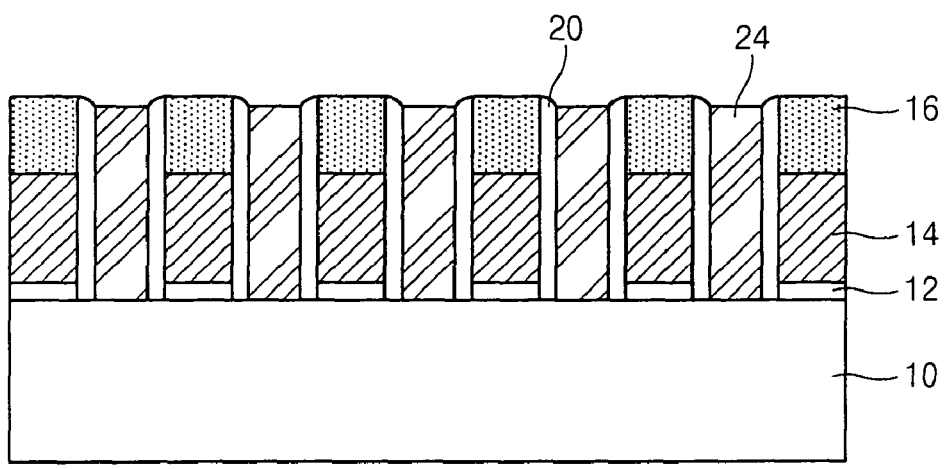
Figure 2A:
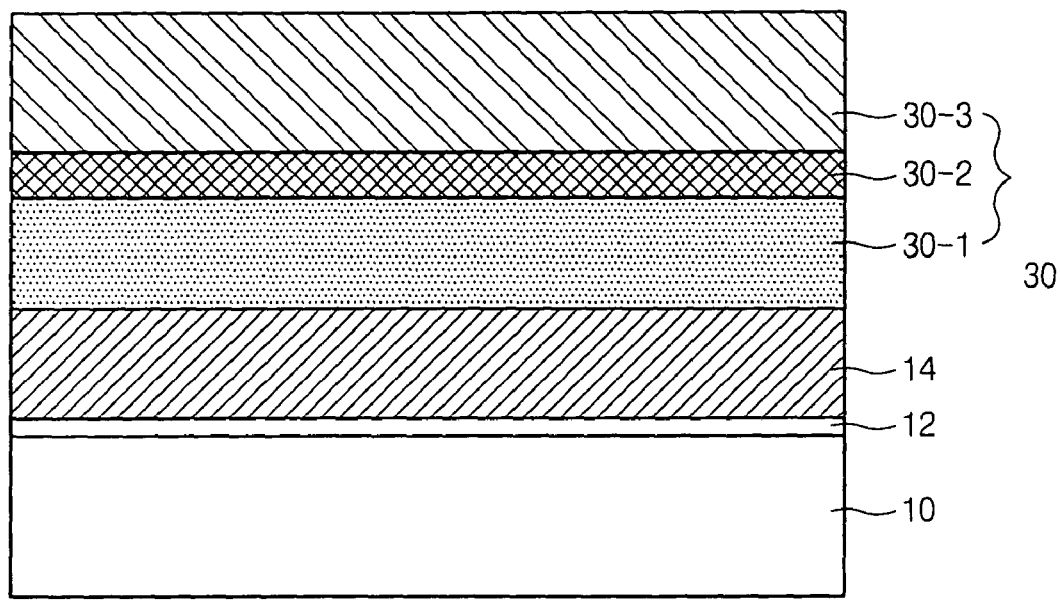
FIGS. 2a through 2d are cross-sectional diagrams illustrating a method for fabricating a semiconductor device in accordance with the present invention.

Referring to FIG. 2a, a gate oxide film 12 is formed on a semiconductor substrate 10. A conductive layer 14 for a gate electrode and a hard mask layer 30 which is preferably a nitride film are sequentially formed on the gate oxide film 12. Even though the hard mask layer 30 may be formed using various materials such as polysilicon film and oxide nitride film depending on a subsequent process, as well as a nitride film. It is preferable that the hard mask layer 30 comprises a stacked structure of a first nitride film 30-1, an oxide film 30-2 and a second nitride film 30-3, which are formed via a plasma induction chemical vapour deposition or a low pressure chemical vapour deposition method. The second nitride film 30-3 serves as a barrier layer in a gate patterning process and a SAC etching process for forming a landing plug contact hole.

Figure 2B:
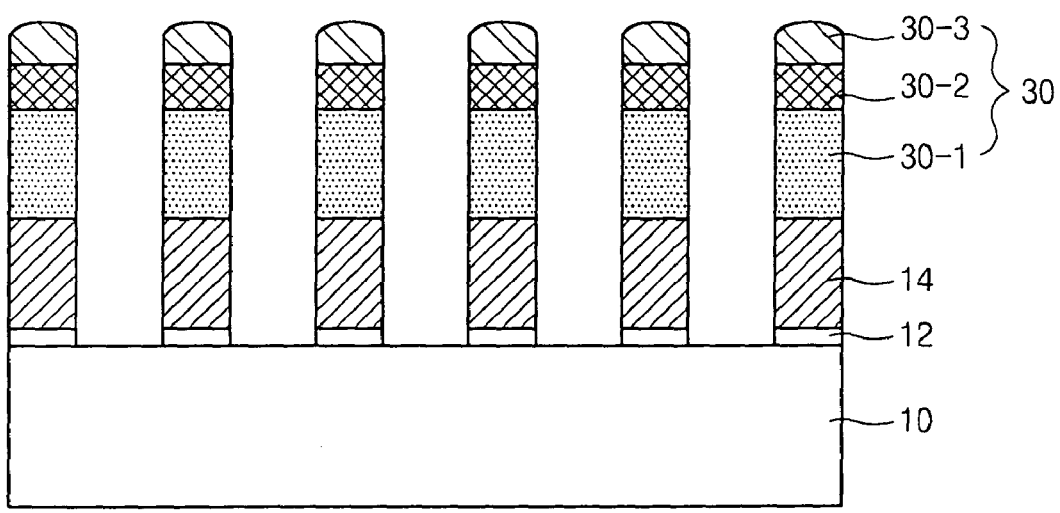

Referring to FIG. 2b, a photoresist film pattern (not shown) for patterning a gate is formed on the hard mask layer 30. The hard mask layer 30, the conductive layer 14 and the gate oxide film 12 are sequentially etched using the photoresist film pattern as a mask to form a stacked structure of a gate electrode 14 and a hard mask layer 30 pattern. A portion of the second nitride film 30-3 in the hard mask layer 30 is removed in the etching process.

Figure 2C:
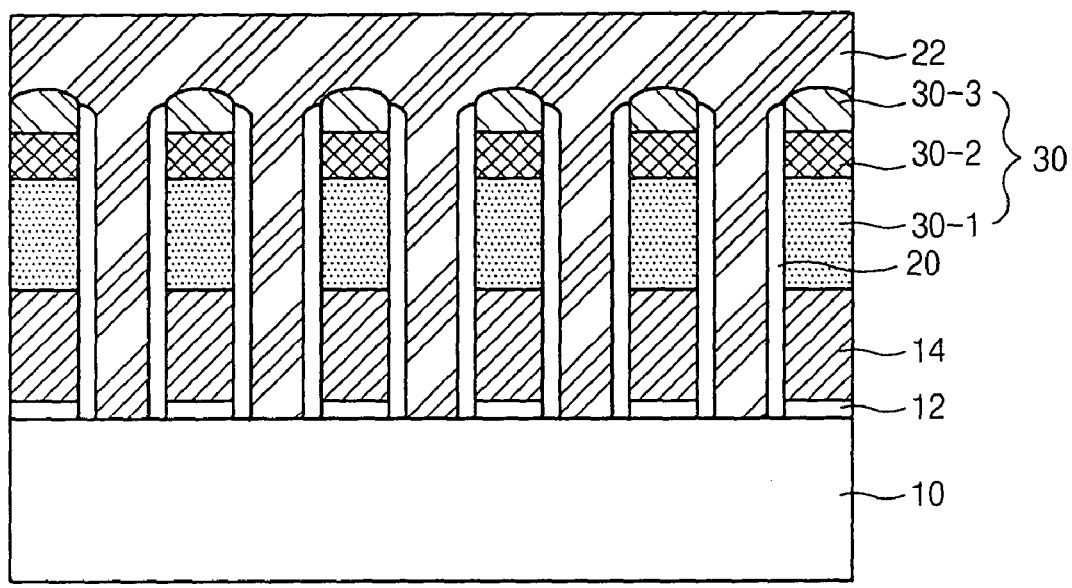
Figure 2D:
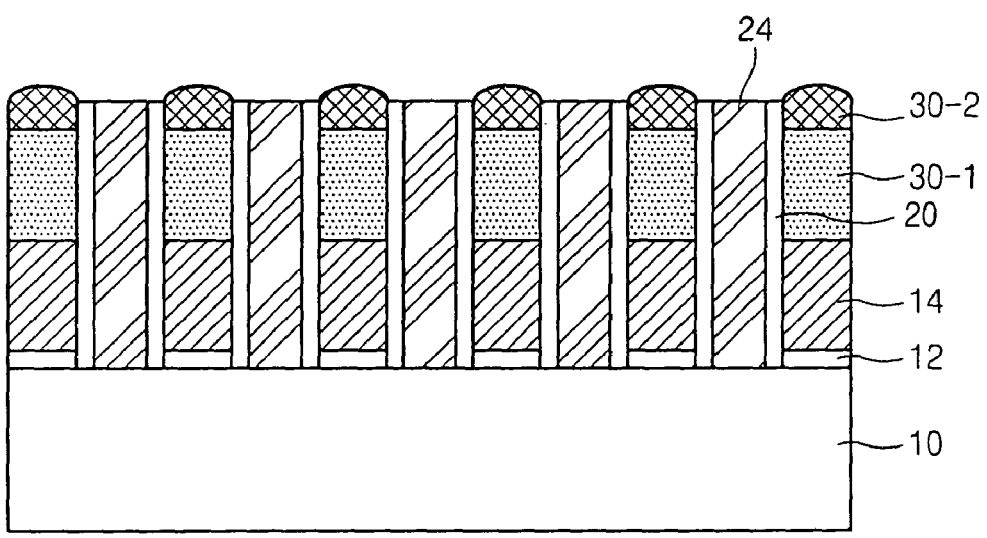

Referring to FIG. 2c, an insulating film spacer 20, preferably an oxide film, nitride film or combination thereof, is formed on a sidewall of the gate electrode 14 and the hard mask layer 30 pattern. Thereafter, an etching barrier layer (not shown) and an interlayer insulating film (not shown) are sequentially formed on the entire surface. A landing plug contact hole is then formed via a SAC method. Next, a polysilicon layer 22 for a landing plug is formed on the entire surface. A portion of the second nitride film 30-3 is removed due to an excessive etching in the process of forming the insulating film spacer 20. However, only a small portion of the second nitride film 30-3 is removed in the contact hole etching process because of the difference in etching selectivity between the interlayer insulating film which is an oxide film and the second nitride film 30-3. As a result, the remaining portion of provide a protection Referring to FIG. 2d, the polysilicon layer 22 is planarized via a CMP process Using the oxide film 30-2 as an etch barrier layer to form a landing plug 24. The remaining second nitride film 30-3 in the hard mask layer 30 is removed, and a portion of the oxide film 30-2 is also removed in the CMP process. The thickness of the residual oxide film 30-2 can be adjusted by controlling conditions and time of the CMP process.

As discussed earlier, the method for fabricating a semiconductor device in accordance with the present invention provides sufficient protection for a lower structure such as a gate electrode in a subsequent etching process without increasing the thickness of the hard mask layer by forming a multi-layered hard mask layer comprising nitride film/oxide film/nitride film. Thin hard mask layer reduces step differences, and prevents generation of voids and patterning problems due to large step differences, resulting in improved characteristics and yield of the device.

What is claimed is:

1. A method for fabricating a semiconductor device, comprising the steps of:
   sequentially forming a gate insulating film and a conductive layer for a gate electrode on a semiconductor substrate;
   forming a multi-layered hard mask layer on the conductive layer;
   etching the hard mask layer, the conductive layer and the gate insulting film using a gate electrode mask to form a stacked structure of a gate insulating film pattern, a gate electrode and a hard mask layer pattern serving as a gate pattern;
   forming an insulating film spacer on a sidewall of the stacked structure;
   forming an interlayer insulating film on the entire surface;
   etching the interlayer insulating film using a landing plug contact etching mask to form a landing plug contact hole exposing the semiconductor substrate;
   forming a conductive layer for a landing plug on the entire surface so as to fill the landing plug contact hole; and
   planarizing the conductive layer for a landing plug to form a landing plug,
   wherein the multi-layered hard mask layer includes a stacked structure of nitride film/oxide film/nitride film serving as a barrier layer during the etching process for a gate pattern.

* * * * *